(12) United States Patent
Takubo

(10) Patent No.: US 7,719,092 B2
(45) Date of Patent: May 18, 2010

(54) POWER SEMICONDUCTOR MODULE

(75) Inventor: Hiromu Takubo, Mitaka (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/424,434

(22) Filed: Jun. 15, 2006

(65) Prior Publication Data

US 2006/0284211 A1 Dec. 21, 2006

(30) Foreign Application Priority Data

Jun. 20, 2005 (JP) .............................. 2005-178860

(51) Int. Cl.
*H01L 23/06* (2006.01)

(52) U.S. Cl. ................ 257/659; 257/E23.191

(58) Field of Classification Search .................. 257/659
See application file for complete search history.

(56) References Cited

U.S. PATENT DOCUMENTS

| | | | | |
|---|---|---|---|---|
| 4,455,545 | A | * | 6/1984 | Shelly ..................... 336/200 |
| 5,220,298 | A | | 6/1993 | Nagase |
| 5,444,297 | A | * | 8/1995 | Oshima et al. ............. 257/691 |
| 5,825,042 | A | * | 10/1998 | Strobel et al. ............ 250/515.1 |
| 5,864,088 | A | * | 1/1999 | Sato et al. ................... 174/386 |
| 6,147,368 | A | | 11/2000 | Kon et al. |
| 6,262,362 | B1 | * | 7/2001 | Czjakowski et al. ........ 174/360 |
| 6,410,981 | B2 | * | 6/2002 | Tao ............................ 257/704 |
| 6,695,985 | B2 | | 2/2004 | Igarashi et al. |
| 6,713,676 | B2 | * | 3/2004 | Fischer ...................... 174/536 |
| 2002/0167017 | A1 | | 11/2002 | Nakabayashi et al. |
| 2003/0011057 | A1 | * | 1/2003 | Nakajima et al. .......... 257/678 |
| 2004/0125529 | A1 | | 7/2004 | Arai et al. |
| 2005/0036291 | A1 | * | 2/2005 | Huang et al. ................ 361/704 |
| 2005/0135065 | A1 | | 6/2005 | Nakatsu et al. |
| 2005/0156251 | A1 | | 7/2005 | Takubo |

FOREIGN PATENT DOCUMENTS

| | | |
|---|---|---|
| CN | 1387746 A | 12/2002 |
| JP | 09-121016 A | 5/1997 |
| JP | 11-127583 A | 5/1999 |

(Continued)

OTHER PUBLICATIONS

Office Action issued in corresponding Chinese Patent Application No. 200610095628X, dated Jan. 16, 2009, with English translation.
Second Office Action issued in corresponding Chinese Patent Application No. 200610095628.X dated Jul. 10, 2009.

*Primary Examiner*—Sue Purvis
*Assistant Examiner*—Benjamin P Sandvik
(74) *Attorney, Agent, or Firm*—Rossi, Kimms & McDowell LLP

(57) ABSTRACT

The power semiconductor module includes a module package housing power semiconductor devices therein and a magnetic core set around the module package, such that magnetic core surrounds the power semiconductor devices such as IGBTs. Alternatively, the magnetic core is built in the module package such that the outer circumference faces of magnetic core and the side faces of module package form side faces of the power semiconductor module. The power semiconductor module according to the invention facilitates replacing the magnetic core, setting the magnetic core around the module package thereof, reducing the size thereof, simplifying the structure thereof, and easy manufacture thereof.

13 Claims, 9 Drawing Sheets

FOREIGN PATENT DOCUMENTS

| | | |
|---|---|---|
| JP | 11-238844 A | 8/1999 |
| JP | 2000-058740 A | 2/2000 |
| JP | 2001-160605 A | 6/2001 |
| JP | 2001-185679 A | 7/2001 |
| JP | 2003-017610 A | 1/2003 |
| JP | 2004-207432 A | 7/2004 |

* cited by examiner

POWER SEMICONDUCTOR MODULE

FIELD OF THE INVENTION

The present invention relates to a power semiconductor module that switches on and off power semiconductor devices incorporated therein to convert electric power. Specifically, the present invention relates to techniques for reducing the switching losses caused by the switching of the power semiconductor devices.

BACKGROUND OF THE INVENTION

FIG. 13 is a block circuit diagram of a conventional electric power converter including power semiconductor modules. In FIG. 13, a DC power supply 1, power semiconductor modules 2U, 2V and 2W, a motor 3 as a load, and a driver circuit 4 for driving power semiconductor modules 2U, 2V and 2W for the respective phases are shown. Each power semiconductor module 2U, 2V or 2W includes two insulated gate bipolar transistors (hereinafter referred to as "IGBTs") connected in series and two free wheel diodes connected in opposite parallel to the respective IGBTs. Power semiconductor modules 2U, 2V and 2W for the respective phases switch on and off the respective IGBTs on the upper arm and the respective IGBTs on the lower arm alternately to convert the AC electric power from DC power supply 1 to AC electric power and to supply the converted AC electric power to motor 3.

Pulse width modulation (hereinafter referred to as "PWM") has been well known as one of the methods for controlling the IGBTs' switching. A control circuit 5 including a comparator 5c is disposed outside power semiconductor modules 2U, 2V and 2W for conducting PWM control. Comparator 5c compares a reference output voltage 5a and a carrier 5b and determines a switching pattern. The determined switching pattern is sent to driver circuit 4. Driver circuit 4 converts the switching pattern to gate signals and sends the gate signals to respective modules 2U, 2V and 2W.

Power semiconductor devices such as the IGBTs and the free wheel diodes are mounted on packages for the respective phases such that power semiconductor modules 2U, 2V and 2W are configured. The power semiconductor module configuration as described above facilitates simplifying the electric power converter structure, assembling the electric power converter easily, wiring the electric power converter easily, and cooling the devices in the electric power converter.

FIG. 14 is a schematic cross sectional view of power semiconductor modules 2U, 2V or 2W. Since each of the power semiconductor modules 2U, 2V and 2W have the same structure, the power semiconductor module is designated in FIG. 14 by the common reference numeral 2. As shown in FIG. 14, circuit patterns 9 are formed on a ceramic insulator substrate 16. Semiconductor chips 8 of the IGBTs and the free wheel diodes are mounted on respective circuit patterns 9. Circuit patterns 9 and semiconductor chips 8 are connected to each other via electrically conductive wires 7 made of aluminum or some other such electrically conductive material. Circuit patterns 9 are connected to an input terminal 2a or 2b connected to DC power supply 1. In FIG. 14, impedance elements 6y, which will be described later in detail, are shown. Impedance elements 6y are fixed to respective input terminals 2a and 2b. An insulator substrate 16 is mounted on the upper surface of a radiator plate 10 made of a copper alloy. A cooling fin 11 is fixed to the back surface of radiator plate 10 for dissipating the losses (heat) caused by semiconductor chips 8 in the electrically conductive states thereof to air. The cooling fin 11 is connected usually to the ground through an earth line 12 to prevent the electrification caused by a contact to cooling fin 11 from occurring.

In the above described conventional electric power converter including power semiconductor modules 2, excessively large switching noises are caused by the switching of the IGBTs and such power semiconductor devices. The excessively large switching noises further cause malfunctions of the other apparatus and equipments disposed around the electric power converter, noises in the other apparatus and equipments and such hazards. The switching noises may be generally classified into two different kinds: normal mode noises and common mode noises.

The normal mode switching noises are noises caused by the normal-mode high-frequency current that flows through the closed loop consisting of power semiconductor module 2 and DC power supply 1. The closed loop 13a, through which the normal mode noise current flows, is shown in FIG. 15(a). In the normal mode, LC resonance is caused by the switching of the power semiconductor devices based on the floating inductance of the wiring constituting closed loop 13a and the junction capacitance of the power semiconductor devices, further causing a high-frequency noise current that flows through closed loop 13a.

The common mode switching noises are noises caused by the noise current that flows through earth line 12 via the floating capacitance (or the earth capacitance) of power semiconductor module 2 and the floating capacitance (or the earth capacitance) inside the electric power converter. The closed loop 13b, through which the common mode noise current flows, is shown in FIG. 15(b). In FIG. 15(b), the floating capacitance 14 caused by the wiring in the electric power converter, the floating capacitance 15a and the floating capacitance 15b of the power semiconductor module 2 are shown.

In the common mode, floating capacitance 14, floating capacitance 15a and floating capacitance 15b are charged and discharged at a high frequency by a high voltage change (dV/dt) caused by the switching of the power semiconductor devices, causing a high-frequency charging and discharging current that flows through closed loop 13b via earth line 12. In some cases, the common mode noise current flows out to the side of DC power supply 1 or the common mode noises are radiated in the form of radio waves.

An impedance element, such as inductance, has generally been added to the noise current loop to suppress the normal mode noise current and the common mode noise current. In FIG. 14, for example, impedance elements 6y are connected in series to respective semiconductor chips 8 for suppressing the normal mode noise current.

As described above, the normal mode noise current and the common mode noise current will be suppressed to some extents, if an impedance element is disposed in the noise current path. If the impedance element for suppressing the noise current is arranged as closely as possible to the power semiconductor device, the entire circuit size may be reduced effectively and the packaging may be conducted effectively.

Conventional methods for suppressing various kinds of noise currents and the electromagnetic waves caused by switching are disclosed in the patent documents described below.

Unexamined Published Japanese Patent Application 2000-58740 discloses a suppressing means for suppressing common mode noises. The suppressing means includes a ring-shaped filter element made of a composite magnetic material and surrounding the positive and negative poles of an inner lead (connection line) for connecting a DC power supply to a semiconductor device (IC chip). The filter element is sealed in a package.

Unexamined Japanese Patent Application Hei. 9 (1997)-121016 discloses a noise reducing element made of an amorphous magnetic alloy. The noise reducing element is set around the lead portion of a diode and such a semiconductor device or molded into a unit with the lead portion of a diode and such a semiconductor device.

Unexamined Published Japanese Patent Application Hei. 11 (1999)-238844 discloses a ring-shaped soft magnetic element made of an amorphous alloy or a micro-crystalline magnetic alloy and disposed around a semiconductor device.

Unexamined Published Japanese Patent Application 2001-160605 discloses an electromagnetic shield structure that surrounds the edges of a semiconductor package substrate, mounted on a printed circuit board by the melting of solder balls and by the bonding with the molten solder balls. The electromagnetic shield structure surrounds the edges of a semiconductor package substrate with a ferrite cap or with an electromagnetic wave absorber such as moldings and a tape made of an electromagnetic wave absorptive resin so that the electromagnetic waves radiated from the junction portions between the solder balls and printed circuit board may be absorbed.

Since the conventional technique disclosed in Unexamined Published Japanese Patent Application 2000-58740 (hereinafter referred to as the "conventional technique 1") seals the filter element made of a composite magnetic material in a package, it is impossible to replace the filter element (to change the inductance value). Usually, the switching noise frequencies vary depending on the surroundings' circuit conditions (such as wiring floating inductance and floating capacitance). Due to this, it is desirable to dispose a filter element, added to a semiconductor device for noise reduction, outside a package so that the filter element may be replaced, if necessary. However, it is impossible for the conventional technique 1 to replace the filter element, even if it is necessary. Since the conventional technique 1 houses the filter element in a package, the package is inevitably large. These problems are also posed on the conventional technique described in FIG. 14.

Since the conventional technique disclosed in Unexamined Japanese Patent Application Hei. 9 (1997)-121016 (hereinafter referred to as the "conventional technique 2") assumes the application thereof to a low-power semiconductor device having lead wires, it is impossible to apply the conventional technique 2 to a middle- or high-power semiconductor module without modification nor improvement. Since large wiring parts such as wide area copper bars are connected to the power module terminal usually to make a high current flow, it is impossible to set the noise reducing element as described in the reference around the power module terminal.

Since the conventional technique disclosed in Unexamined Published Japanese Patent Application Hei. 11 (1999)-238844 sets a ring-shaped soft magnetic element around a semiconductor device in almost the same manner as the conventional technique 1, the desired noise reduction effects may not be obtained, if the peripheral circuit conditions are unfavorable.

When an electromagnetic shield is formed using a cap by the conventional technique disclosed in Unexamined Published Japanese Patent Application 2001-160605 (hereinafter referred to as the "conventional technique 4"), it is necessary to provide the inner surface height of the cap with a certain leeway, since variations are caused between the molten states of the solder balls. Therefore, it is troublesome to manage the cap size and to design the cap. The cap is shaped with a cover having a window and manufactured through many manufacturing steps, causing high manufacturing costs. It is hard to replace the moldings or the tape used for the electromagnetic wave absorber according to the conventional technique 4, even when it is necessary to replace the electromagnetic wave absorber corresponding to the frequencies of the noises to be absorbed.

In view of the foregoing, it would be desirable to provide a power semiconductor module that facilitates replacing the magnetic element such as a ferrite core (hereinafter referred to as the "magnetic core") thereof and reducing the size thereof. It would be also desirable to provide a power semiconductor module that facilitates setting a magnetic core around the module package securely. It would be further desirable to provide a power semiconductor module provided with a magnetic core having a relatively simple structure and easy to manufacture.

SUMMARY OF THE INVENTION

The invention provides a power semiconductor module that facilitates replacing the magnetic element such as a ferrite core (hereinafter referred to as the "magnetic core") thereof and reducing the size thereof. The invention also provides a power semiconductor module that facilitates setting a magnetic core around the module package securely. Still further, the invention provides a power semiconductor module provided with a magnetic core having a relatively simple structure and easy to manufacture.

Specifically, a power semiconductor module includes: a module package housing power semiconductor devices therein; and a magnetic core, the magnetic core being set around the module package such that the magnetic core surrounds the power semiconductor devices. The relative magnetic permeability and the cross section of the frame-shaped magnetic core are selected to provide the magnetic core with a predetermined inductance value so that a predetermined reactance value may be obtained at the frequency of the noise current to be reduced.

Further, a power semiconductor module includes: a module package housing power semiconductor devices therein; and a magnetic core, the magnetic core being built in the module package such that the outer circumference faces of the magnetic core and the side faces of the module package form side faces of the power semiconductor module. In other words, a frame-shaped magnetic core, made of a material different from the material for the module package, is built in the side faces of the module package such that the magnetic core surrounds the power semiconductor devices.

Still further, a power semiconductor module includes: a module package housing power semiconductor devices therein; and a magnetic core, the magnetic core being formed by coating magnetic powders on the sides of the module such that the magnetic core surrounds the power semiconductor devices.

The magnetic core preferably includes a first core piece and a second core piece arranged in a coaxial manner, and the inductance value of the first core piece and the inductance value of the second core piece are different from each other at certain frequencies.

The magnetic core is preferably formed of thin magnetic plates laminated in a coaxial manner.

An air gap is preferably formed across the magnetic core in perpendicular to the circumference thereof so that the inductance value of the magnetic core may be adjusted.

The power semiconductor module further preferably includes protrusions or grooves formed on the side faces of the module package, and the magnetic core is coupled with the protrusions or grooves such that the magnetic core is fixed to the module package and prevented from moving by vibrations.

A frame-shaped magnetic core, set around a module package according to the invention, facilitates suppressing the noise current without enlarging the module package and facilitates reducing the power semiconductor module size.

The magnetic core set around the module package facilitates the replacement thereof to another magnetic core that exhibits an optimum inductance value at the noise frequency that depends on the peripheral circuit conditions. Since the magnetic core according to the invention has a simple structure, the magnetic core according to the invention is manufactured easily and it is expected to reduce the manufacturing costs thereof. If the magnetic core is coupled with the protrusions formed on the module package side faces such that magnetic core is fixed to the module package, the magnetic core is prevented from moving and falling away from the module package by vibrations.

BRIEF DESCRIPTION OF THE DRAWINGS

The invention will be described with reference to certain preferred embodiments thereof and the accompany drawings, wherein.

DETAILED DESCRIPTION OF THE PREFERRED EMBODIMENTS

Figure 1:
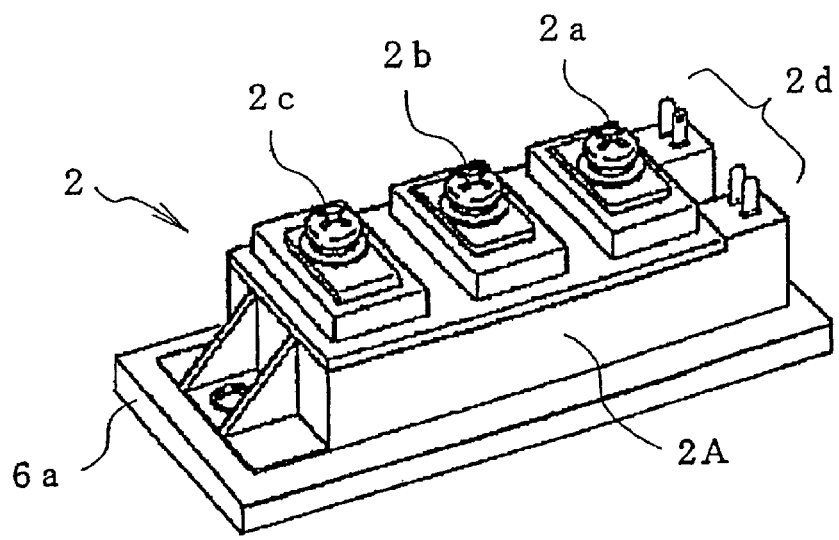
FIG. 1 is a perspective view of a power semiconductor module according to a first embodiment of the invention including a module package and a magnetic core set around the module package.
Figure 2:
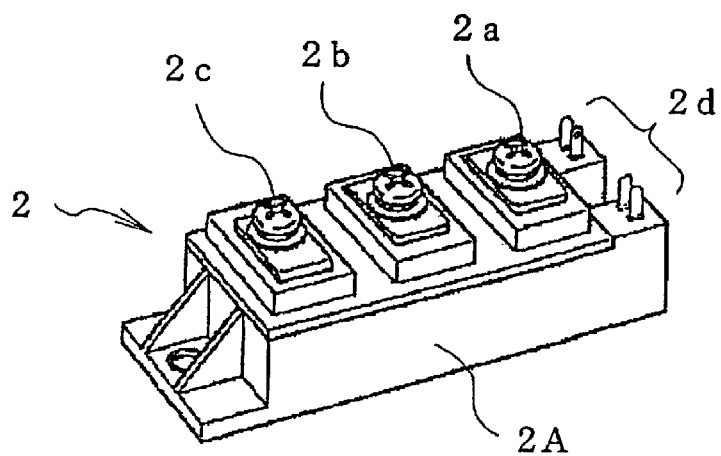
FIG. 2 is a perspective view of the module package shown in FIG. 1.

FIG. 1 is a perspective view of a power semiconductor module according to a first embodiment of the invention including a module package 2A and a magnetic core 6a set around module package 2A. FIG. 2 is a perspective view of module package 2A shown in FIG. 1.

Figure 13:
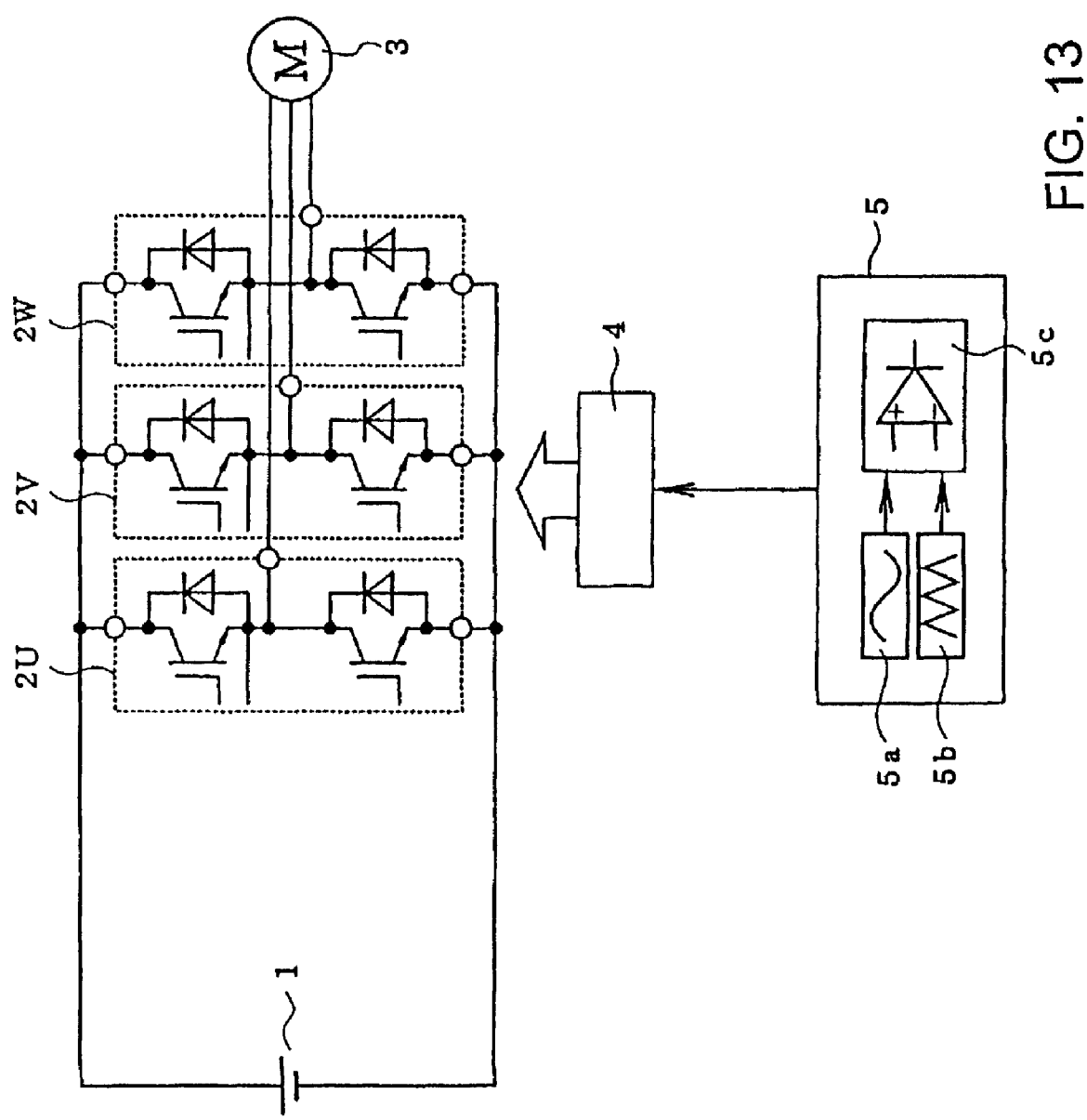
FIG. 13 is a block circuit diagram of a conventional electric power converter including power semiconductor modules.

Referring now to these figures, power semiconductor module 2 has a structure same with that of the conventional power semiconductor module. The entire semiconductor module 2 is shaped almost with a rectangular parallelepiped. Semiconductor module 2 includes a module package 2A made of a resin and such an insulator. Module package 2A houses IGBTs as power semiconductor devices for the upper and lower arms for a phase and free wheel diodes therein as shown in FIG. 13. On the upper surface of module package 2A, DC input terminals 2a and 2b and an AC output terminal 2c are arranged appropriately. Control terminals 2d for connecting the IGBTs to the driver circuit outside module package 2A are disposed on the upper surface of module package 2A.

According to the first embodiment, a magnetic core 6a shaped with a frame capable of accepting the planar external shape of module package 2A is set around the lower portion of module package 2A. Due to this configuration, the power semiconductor devices housed in module package 2A are surrounded by magnetic core 6a. It is desirable to employ ferrite and such a material, which exhibit a high magnetic permeability and excellent high-frequency characteristics, for magnetic core 6a. In detail, it is preferable to select a material that facilitates obtaining a sufficiently large reactance value at the frequencies of noises to be reduced based on the inductance of magnetic core 6a. The material selection facilitates making magnetic core 6a work for a high-impedance element against the noise current and reducing the noise current. If the frequencies of noises to be reduced are low, a steel plate and such a material may be used alternatively with no problem.

Figure 3:
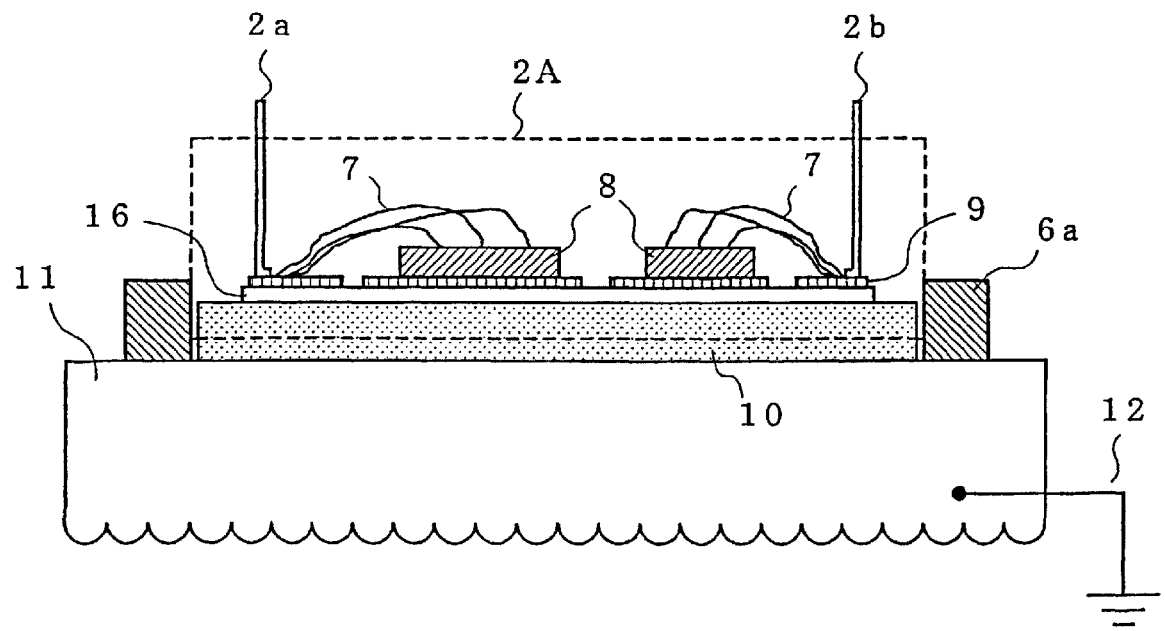
FIG. 3 is a cross sectional view of the power semiconductor module according to the first embodiment under the use thereof.

FIG. 3 is a cross sectional view of the power semiconductor module according to the first embodiment of the invention under the use thereof. Since the arrangement of the terminals on power semiconductor module 2 is not included in the subject matter of the invention, the arrangement of DC input terminals 2a and 2b in FIG. 3 does not always coincide with the arrangement thereof in FIGS. 1 and 2.

Figure 14:
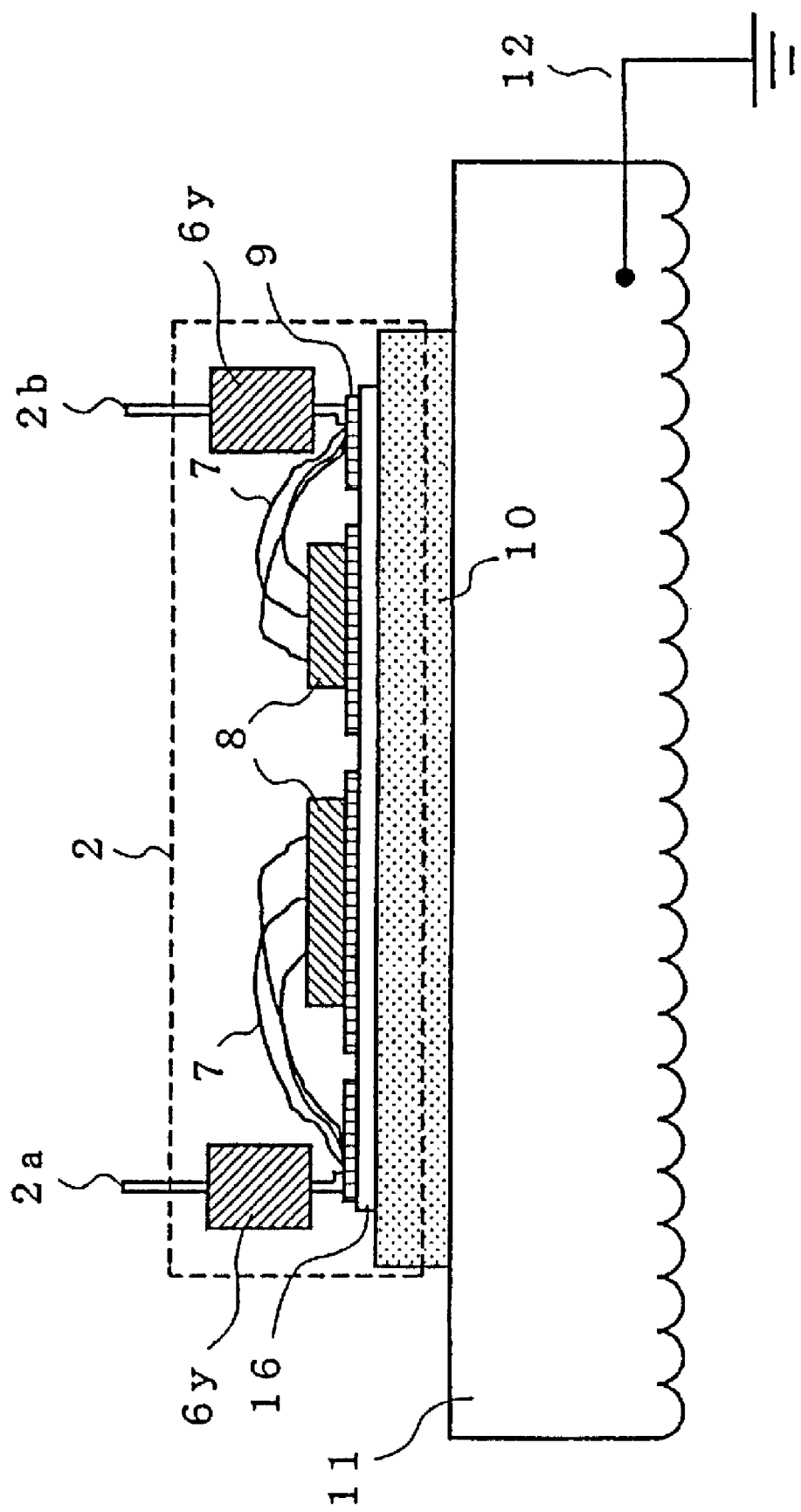
FIG. 14 is a schematic cross sectional view of a conventional power semiconductor module under the use thereof.

The internal structure of power semiconductor module 2 and the configuration of the peripheral heat dissipating means are the same with those in FIG. 14. In FIG. 3, circuit patterns 9, ceramic insulator substrate 16, radiator plate 10, cooling fin 11, and earth line 12 are shown. As shown in FIG. 3, magnetic core 6a is set around the lower portion of module package 2A so that magnetic core 6a may be detached and replaced easily depending on the frequencies of the noises to be suppressed.

Although magnetic core 6a may be simply pressed to be set around the lower portion of module package 2, it is necessary for every portion of magnetic core 6a and module package 2A to exhibit very strict dimensional precision. Moreover, there is an apprehension that magnetic core 6a is displaced from module package 2A by vertical vibrations and brought into contact with any of the terminals on module package 2A.

Figure 4:
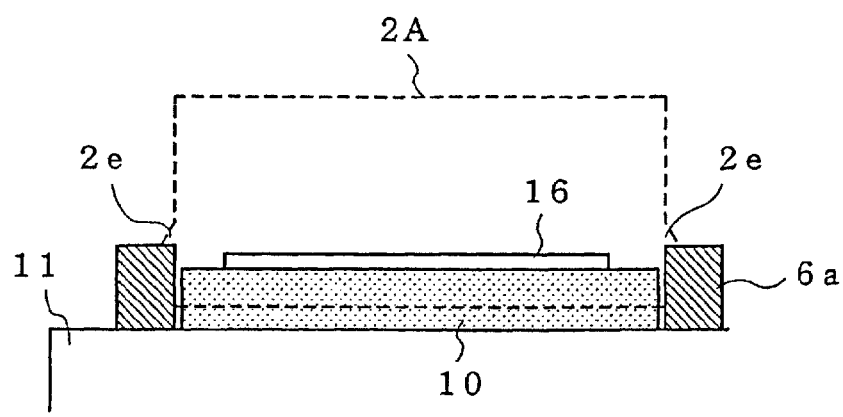
FIG. 4 is a cross sectional view of the power semiconductor module according to the first embodiment showing a setting structure for setting the magnetic core around the module package.

For preventing magnetic core 6a from falling away from module package 2A, nail-shaped protrusions 2e are formed in the vicinity of the setting area of magnetic core 6a on module package 2A as shown in FIG. 4. Magnetic core 6a is set around the lower portion of module package 2A such that magnetic core 6a is coupled with protrusions 2e and sandwiched by protrusions 2 and the upper surface of cooling fin 11. This structure facilitates suppressing the vertical movement of magnetic core 6a relative to module package 2A and preventing magnetic core 6a from displacing vertically by vibrations.

Figure 5:
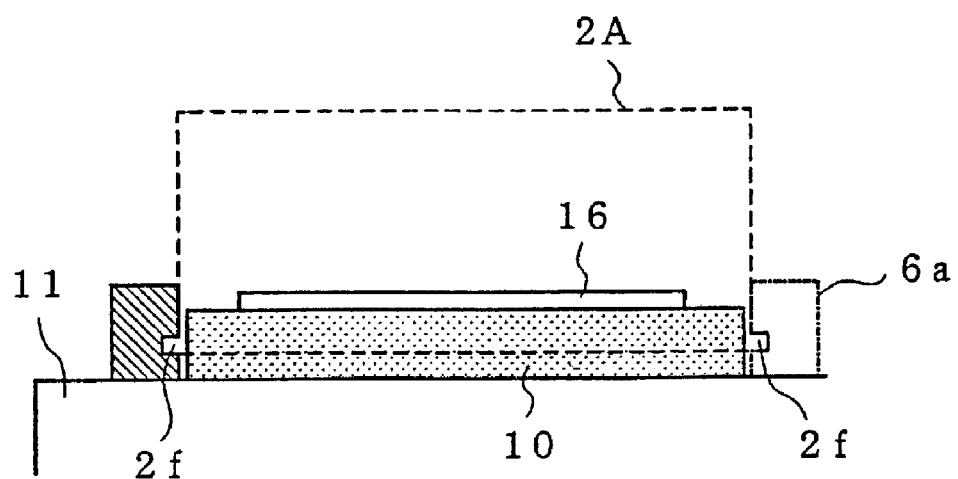
FIG. 5 is a cross sectional view of the power semiconductor module according to the first embodiment showing another setting structure for setting the magnetic core around the module package.

Alternatively, protrusions 2f are formed on the lower side faces of module package 2A as shown in FIG. 5. Recesses are formed at the locations on the inner circumference faces of magnetic core 6a corresponding to protrusions 2f so that protrusions 2f may be fit into the respective recesses. Still alternatively, protrusions are formed on the inner circumference faces of magnetic core 6a, recesses are formed at the locations on the lower side faces of module package 2A corresponding to the protrusions, and the protrusions are fit into the recesses, although not illustrated. When the structure shown in FIG. 5 is employed, it is effective to divide magnetic core 6a into two pieces, to set the divided pieces of the magnetic core around module package 2A from both sides thereof and to tightly bonds the edge faces of the divided magnetic core pieces. In FIGS. 4 and 5, the inside of module package 2A is shown only partly.

Figure 6:
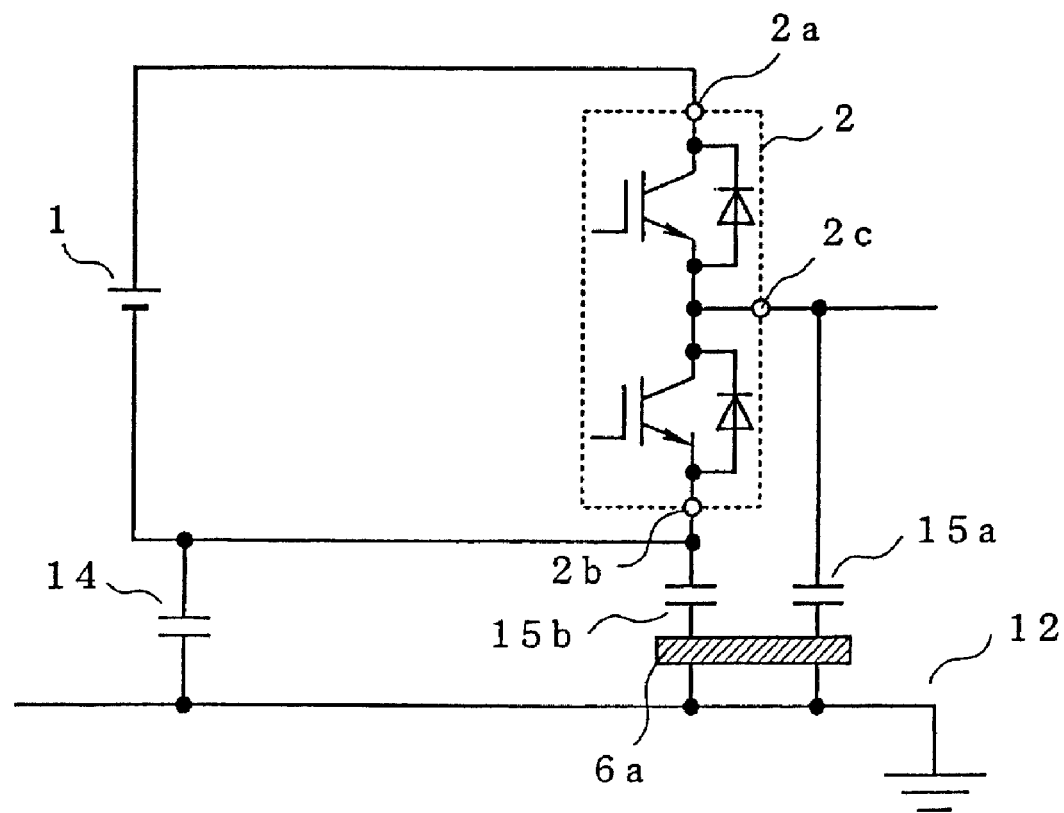
FIG. 6 is a block circuit diagram of the power semiconductor module according to the first embodiment.
Figure 15A:
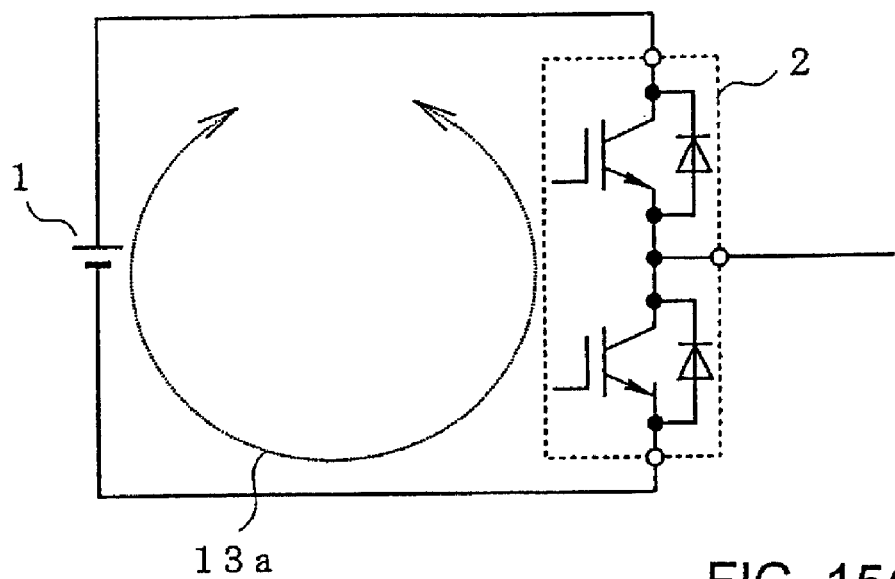
FIG. 15(a) is a diagram showing a path, through which a normal mode noise current flows.
Figure 15B:
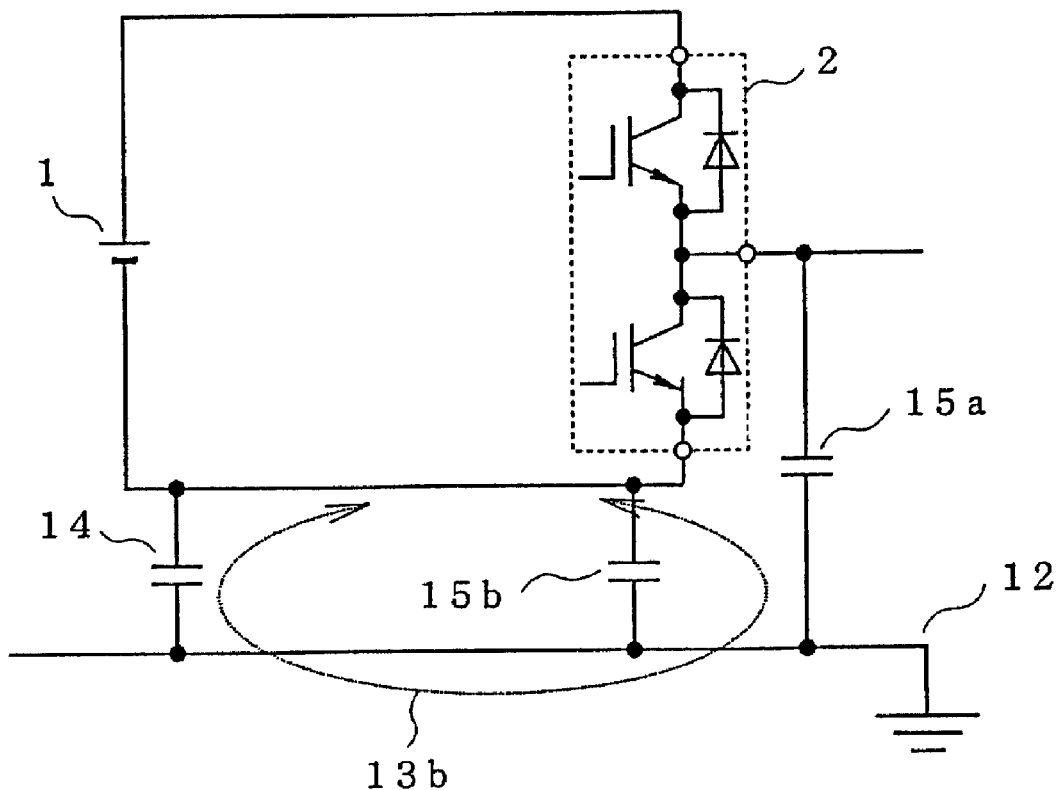
FIG. 15(b) is a diagram showing a path, through which a common mode noise current flows.

FIG. 6 is a block circuit diagram of the power semiconductor module according to the first embodiment. As described above, the circuit of the power semiconductor module according to the first embodiment is equivalent to the state, in which magnetic core 6a is inserted almost in series to floating capacitance 15a and floating capacitance 15b between power semiconductor module 2 and earth line 12 (cooling fin 11), due to the setting of magnetic core 6a around module package 2A. Therefore, magnetic core 6a works for an impedance element (inductance) in closed loop 13b shown in FIG. 15(b), through which a common mode noise current flows. Magnetic core 6a working for an impedance element facilitates increasing the impedance value in closed loop 13b and reducing the noise current.

The inductance value of frame-shaped magnetic core 6a is given by the following numerical formula (1).

$$L=(\mu_0 \times \mu_r) \times N^2 \times (S/l) \tag{1}$$

Here, $\mu_0$ is the magnetic permeability of vacuum, $\mu_r$ the relative magnetic permeability of the magnetic core, N the number of turns (=1), S the magnetic path cross section, and l the magnetic path length. As the numerical formula (1) indicates, by using a material exhibiting a high relative magnetic permeability for magnetic core 6a, a large inductance value is obtained and a common mode reactor, exhibiting a large reactance value (impedance value) over the frequency range of the high frequency noise current between several hundreds kHz and several tens MHz, is realized.

Figure 7:
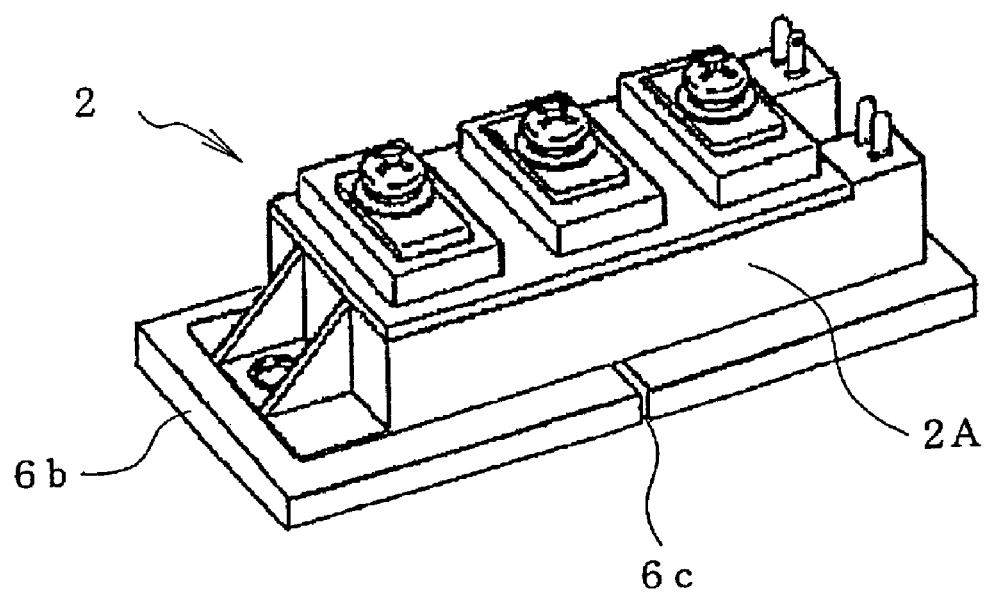
FIG. 7 is a perspective view of a power semiconductor module according to a second embodiment of the invention.

FIG. 7 is a perspective view of a power semiconductor module according to a second embodiment of the invention. Referring now to FIG. 7, a magnetic core 6b according to the second embodiment is formed by disposing an air gap 6c across magnetic core 6a according to the first embodiment in perpendicular to the circumference thereof and set around the lower portion of module package 2A. Magnetic core 6b may be fixed in the same manner as according to the first embodiment and as shown in FIGS. 4 and 5. By adjusting the length of air gap 6c, the inductance value of magnetic core 6b is adjusted at an optimum value.

Figure 8:
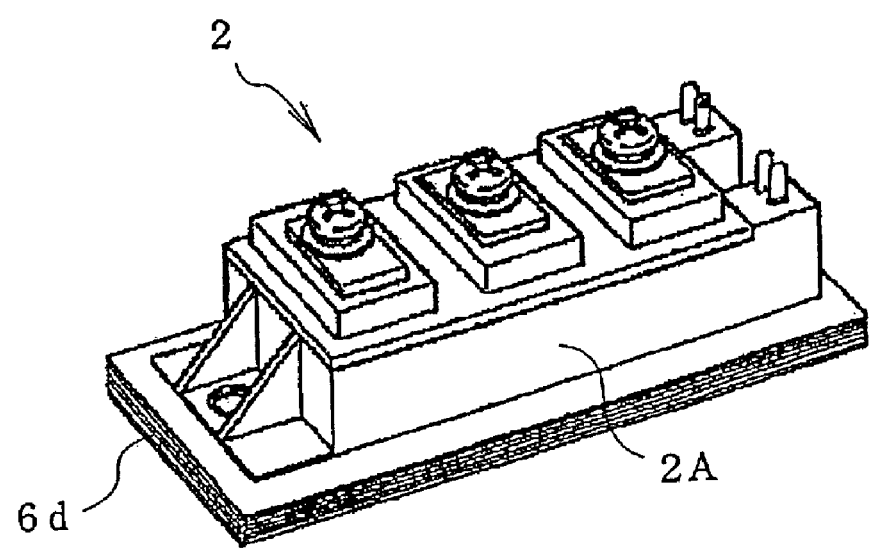
FIG. 8 is a perspective view of a power semiconductor module according to a third embodiment of the invention.

FIG. 8 is a perspective view of a power semiconductor module according to a third embodiment of the invention. Referring now to FIG. 8, a magnetic core 6d according to the third embodiment is formed of many soft-magnetic-metal thin plates laminated in a coaxial manner. The soft-magnetic-metal thin plate is made of an amorphous alloy or a magnetic alloy having a microcrystalline structure. The soft-magnetic-metal thin plate exhibits a high magnetic permeability at the noise current frequency. Magnetic core 6d is shaped with a frame in the same manner as magnetic core 6a according to the first embodiment. Alternatively, an air gap may be formed across magnetic core 6d in the same manner as in magnetic core 6b according to the second embodiment. By setting magnetic core 6d around the lower portion of module package 2A, the impedance value in the noise current path is increased at a predetermined frequency and the noise current is reduced.

Figure 9:
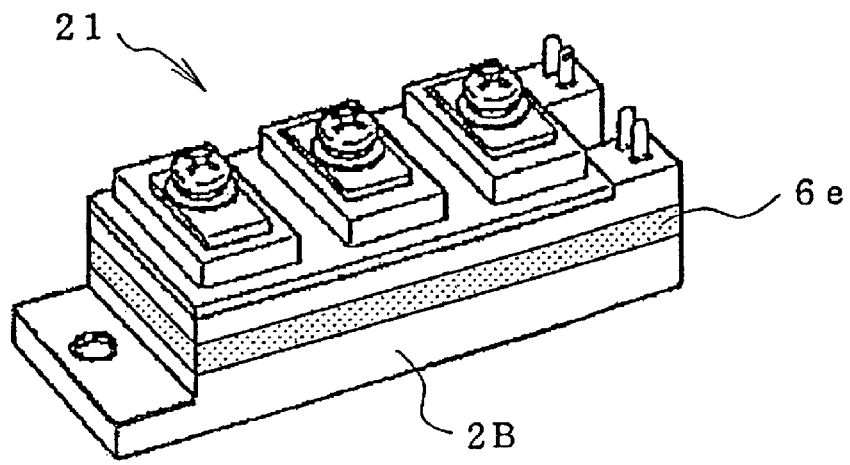
FIG. 9 is a perspective view of a power semiconductor module according to a fourth embodiment of the invention.

FIG. 9 is a perspective view of a power semiconductor module according to a fourth embodiment of the invention. Referring now to FIG. 9, the power semiconductor module 21 according to the fourth embodiment includes a module package 2B and a magnetic core 6e made of a material different from the material for module package 2B and built in a part of module package 2B. Magnetic core 6e is made of ferrite and such a material and shaped with a frame such that the outer circumference faces thereof and the outer circumference faces (side faces) of module package 2B form flat side faces of power semiconductor module 21.

Figure 10:
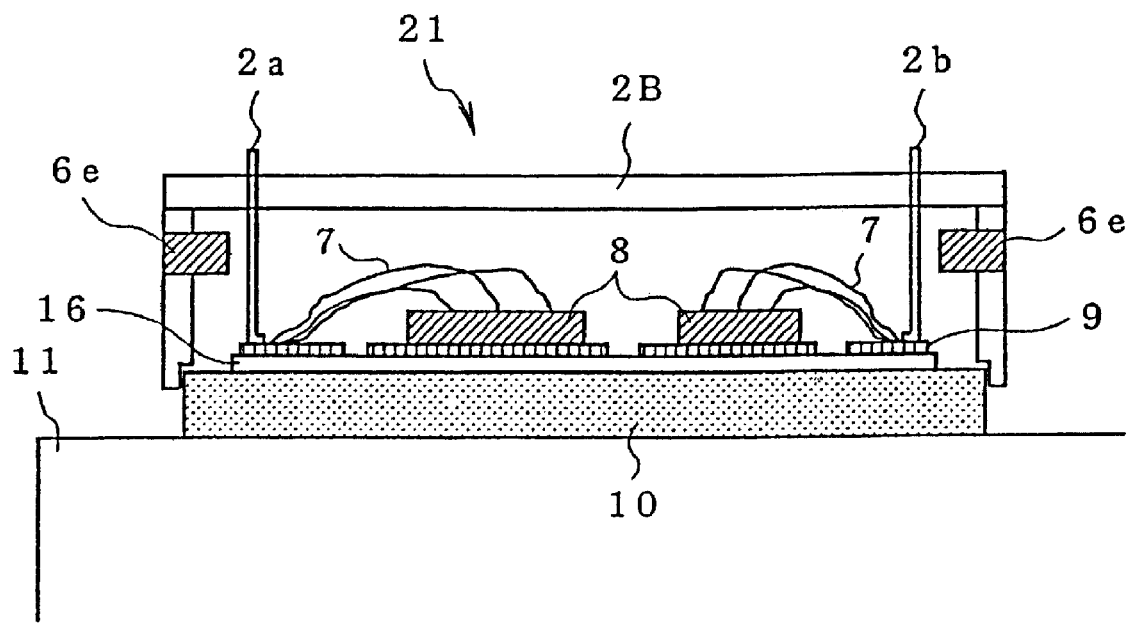
FIG. 10 is a cross sectional view of the power semiconductor module according to the fourth embodiment under the use thereof.

FIG. 10 is a cross sectional view of the power semiconductor module according to the fourth embodiment under the use thereof. The internal structure of module 21 is the same with those of power semiconductor modules according to the first through third embodiments. Although not illustrated, a groove that encircles module package 2B may be formed in the side faces thereof and a frame-shaped magnetic core may alternatively be buried in the groove.

Figure 11:
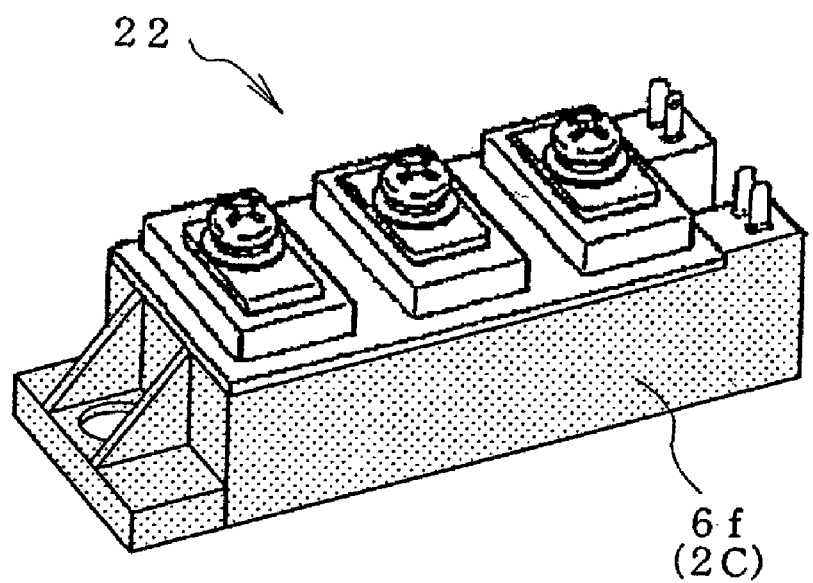
FIG. 11 is a perspective view of a power semiconductor module according to a fifth embodiment of the invention.

FIG. 11 is a perspective view of a power semiconductor module according to a fifth embodiment of the invention. Referring now to FIG. 11, the power semiconductor module 22 according to a fifth embodiment includes a module package 2C and a magnetic core 6f formed by coating magnetic powders on the side faces of module package 2C. Magnetic core 6f that surrounds the power semiconductor devices in module package 2C facilitates obtaining a reactor equivalent to the reactor obtained by the power semiconductor modules according to the first through fourth embodiments. Alternatively, magnetic powders may be coated in a belt encircling module package 2C such that an external appearance as shown in FIG. 9 is obtained with no problem. The magnetic powders are dispersed in an organic solvent, oil, and such a solvent and, then, coated on module package 2C. The material for the magnetic powder, the particle diameter thereof, the quantity thereof, and the coating film thickness are determined appropriately considering the noise current frequency.

Figure 12:
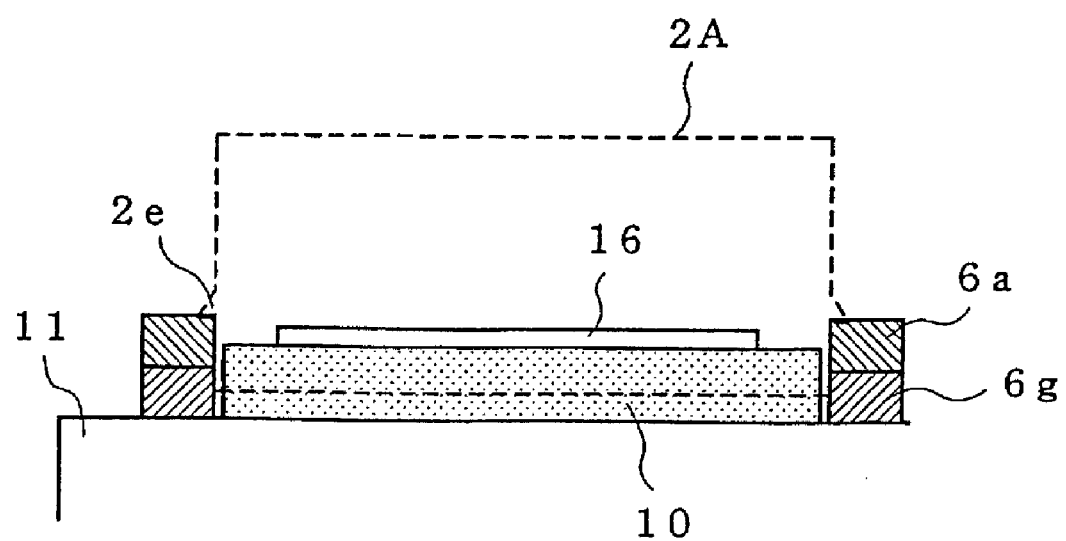
FIG. 12 is a cross sectional view of a power semiconductor module according to a sixth embodiment of the invention under the use thereof.

FIG. 12 is a cross sectional view of a power semiconductor module according to a sixth embodiment of the invention under the use thereof. The power semiconductor module according to the sixth embodiment includes frame-shaped magnetic cores 6a and 6g made of different materials, the inductance values thereof are different at certain frequencies. Magnetic cores 6a and 6g are laminated in a coaxial manner and set around the lower portion of module package 2A. Alternatively, protrusions 2e may be formed on module package 2A as shown in FIG. 4 and magnetic cores 6a and 6g may be fixed with protrusions 2e.

Although the magnetic core inductance is given by the numerical formula (1) as described earlier, the relative permeability $\mu_r$ of the magnetic core exhibits frequency dependence. Since $\mu_r$ is smaller as the frequency is higher, the inductance value becomes smaller as the frequency increases, making it harder to suppress the noises. According to the sixth embodiment, magnetic core 6a made of a material that exhibits the predetermined permeability at a low frequency and magnetic core 6g made of a material that exhibits the other predetermined permeability at a high frequency are combined and laminated. The laminate of magnetic cores 6a and 6g is set around the lower portion of module package 2A to obtain certain inductance values over a wide frequency range between a low frequency and a high frequency and to obtain noise reduction effects over the wide frequency range. In FIG. 12, the inside of module package 2A is shown only partly.

In the power semiconductor devices according to the first through sixth embodiments, it is not always necessary to form magnetic cores 6a, 6b, 6d, 6e, and 6g of one single constituent piece. For example, a C-shaped core piece and an I-shaped core piece are combined and fixed to each other to form a magnetic core shaped with a frame.

The power semiconductor modules according to the first through sixth embodiments of the invention facilitate suppressing the noise current caused by the switching of the power semiconductor devices effectively. Since it is not necessary to house the magnetic core in the module package, the module package is prevented from increasing the dimensions thereof. Since it is easy to replace the magnetic core, it is possible to select the most suitable material for the magnetic core for noise reduction, even if the noise current frequency is different depending on the peripheral circuit conditions.

The invention is applicable not only to the power module, which houses power semiconductor devices on the upper and lower arms for a phase in a module package, but also to the power module (the so-called intelligent power module), which houses power semiconductor devices and a driver circuit for driving the power semiconductor devices in a module package.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-178860, filed on 20 Jun. 2005. The disclosure of the priority application, in its entirety, including the drawings, claims, and the specification thereof, is incorporated herein by reference.

What is claimed is:

1. A power semiconductor module comprising:
a radiator plate having a first side and a second side opposite to the first side;
a substrate with a plurality of power semiconductor devices on the first side of the radiator plate;
a module package housing the substrate with the power semiconductor devices and part of the radiator plate, while maintaining the second side of the radiator plate exposed; and
a magnetic core impedance element, fit around and surrounding the module package, while leaving at least the second side of the radiator exposed, through which a noise current flows out of the power semiconductor module when power is applied to an input terminal of the power semiconductor module.

2. The power semiconductor module according to claim 1, wherein the magnetic core comprises a first core piece and a second core piece arranged in a coaxial manner, and the inductance value of the first core piece and the inductance value of the second core piece are different from each other at certain frequencies.

3. The power semiconductor module according to claim 1, wherein the magnetic core comprises thin magnetic plates laminated in a coaxial manner.

4. The power semiconductor module according to claim 1, further comprising an air gap formed across the magnetic core perpendicular to the circumference thereof.

5. The power semiconductor module according to claim 1, further comprising protrusions formed on the side faces of the module package, wherein the magnetic core includes corresponding recesses such that the protrusions fit into the recesses in order to fix the magnetic core around the circumference of the module package.

6. The power semiconductor module according to claim 1, further comprising recesses formed on the side faces of the module package, wherein the magnetic core includes corresponding protrusions that fit into the recesses in order to fix the magnetic core around the circumference of the module package.

7. A power semiconductor module comprising:
a radiator plate having a first side and a second side opposite to the first side;
a substrate with a plurality of power semiconductor devices on the first side of the radiator plate;
a module package housing the substrate with the power semiconductor devices and part of the radiator plate, while maintaining the second side of the radiator plate exposed; and
a magnetic core impedance element built in the module package, wherein outer circumference faces of the magnetic core and side faces of the module package forming side faces of the power semiconductor module while leaving at least the second side of the radiator exposed, through which a noise current flows out of the power semiconductor module when power is applied to an input terminal of the power semiconductor module.

8. The power semiconductor module according to claim 7, wherein the magnetic core comprises a first core piece and a second core piece arranged in a coaxial manner, and the inductance value of the first core piece and the inductance value of the second core piece are different from each other at certain frequencies.

9. The power semiconductor module according to claim 7, wherein the magnetic core comprises thin magnetic plates laminated in a coaxial manner.

10. The power semiconductor module according to claim 7, further comprising an air gap formed across the magnetic core perpendicular to the circumference thereof.

11. A power semiconductor module comprising:
a radiator plate having a first side and a second side opposite to the first side;
a substrate with a plurality of power semiconductor devices on the first side of the radiator plate;
a module package housing the substrate with the power semiconductor devices and part of the radiator plate, while maintaining the second side of the radiator plate exposed; and
a magnetic core impedance element through which a noise current flows out of the cower semiconductor module when cower is applied to an input terminal of the power semiconductor module;
wherein the magnetic core impedance element comprises magnetic powders coated on side faces of module package, with the magnetic core surrounding the power semiconductor devices, while leaving at least the second side of the radiator exposed.

12. The power semiconductor module according to claim 11, wherein the magnetic core comprises a first core piece and a second core piece arranged in a coaxial manner, and the inductance value of the first core piece and the inductance value of the second core piece are different from each other at certain frequencies.

13. The power semiconductor module according to claim 11, further comprising an air gap formed across the magnetic core perpendicular to the circumference thereof.

* * * * *